United States Patent
Stamper

(10) Patent No.: US 8,945,956 B2
(45) Date of Patent: Feb. 3, 2015

(54) METROLOGY TEST STRUCTURES IN TEST DIES

(71) Applicant: International Business Machines Corporation, Armonk, NY (US)

(72) Inventor: Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 13/649,612

(22) Filed: Oct. 11, 2012

(65) Prior Publication Data

US 2014/0061641 A1    Mar. 6, 2014

Related U.S. Application Data

(60) Provisional application No. 61/695,573, filed on Aug. 31, 2012.

(51) Int. Cl.
*H01L 21/00* (2006.01)

(52) U.S. Cl.
USPC .................................. 438/18; 257/E21.522

(58) Field of Classification Search
CPC ................................ H01L 22/34; H01L 22/30
USPC .......... 438/11, 14, 18; 257/E21.522, E21.523
See application file for complete search history.

(56) References Cited

U.S. PATENT DOCUMENTS

| | | | |
|---|---|---|---|
| 6,732,002 B1 | 5/2004 | Weiner et al. | |
| 7,557,596 B2 | 7/2009 | Eldridge et al. | |
| 7,581,202 B2 | 8/2009 | Perez | |
| 7,739,065 B1 | 6/2010 | Lee et al. | |
| 8,095,907 B2 | 1/2012 | Bickford et al. | |
| 2003/0006413 A1* | 1/2003 | Chawla et al. | 257/48 |
| 2011/0173586 A1 | 7/2011 | Bruce et al. | |

OTHER PUBLICATIONS

Boning et al., "Pattern Dependent Modeling for CMP Optimization and Control", MRS Spring Meeting, Proc. Symposium P: Chemical Mechanical Polishing, San Francisco, CA, Apr. 1999, pp. 1-13.
Anonymous, "Method for a NAND-fil Test Chip", IPCOM000009252D, ip.com, Aug. 13, 2012, 6 pages.
Liu et al., "Chip-Level CMP Modeling and Smart Dummy for HDP and Conformal CVD Films", Proceedings of CMPMIC 1999, pp. 120-127.
Stamper et al., "Advanced Excursion Control and Diagnostics for CMP Process Monitoring", Advanced Semiconductor Manufacturing Conference (ASMC), 22nd Annual IEEE/SEMI, 2011, pp. 1-3.

* cited by examiner

*Primary Examiner* — Quoc Hoang
(74) *Attorney, Agent, or Firm* — Anthony Canale; Roberts Mlotkowski Safran & Cole, P.C.

(57) ABSTRACT

Test dies having metrology test structures and methods of manufacture are disclosed. The method includes forming one or more metrology test structures in a test die that are identical to one or more structures formed in an adjacent product chip.

19 Claims, 7 Drawing Sheets

| 1 | 2 | 2 | 2 | 2 | 2 | 2 | 2 | 2 | 2 | 2 | 2 |
|---|---|---|---|---|---|---|---|---|---|---|---|
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |

FIG. 1A

METROLOGY TEST STRUCTURES IN TEST DIES

FIELD OF THE INVENTION

The invention relates to semiconductor structures and methods of manufacture and, more particularly, to test dies comprising metrology test structures and methods of manufacture.

BACKGROUND

Integrated circuit switches used in integrated circuits can be formed from solid state structures (e.g., transistors) micro electro mechanical systems (MEMS), formed from passive wires inside a hermetically sealed cavity. Other devices formed inside a cavity include bulk acoustic wave filters (BAW filters) or resonators (BAR), or motion detectors and accelerometers. One such example is cellular telephone chips containing a power amplifier (PA) and circuitry tuned for each broadcast mode. Integrated switches on the chip would connect the PA to the appropriate circuitry so that one PA per mode is not required.

For illustrative purposes MEMS switch devices are discussed herein, although the discussion applies to any device formed inside a cavity. MEMS structures can come in many different forms, which are fabricated using many different processes, including chemical mechanical planarization (CMP) processes. In general, many of the methodologies, i.e., technologies, employed to manufacture MEMS have been adopted from integrated circuit (IC) technology. In particular, the fabrication of MEMS uses three basic building blocks: (i) deposition of thin films of material on a substrate, (ii) applying a patterned mask on top of the films by photolithographic imaging, and (iii) etching the films selectively to the mask. In addition, the CMP processes can be used to planarize materials, e.g., materials comprising the MEMS beam. However, CMP steps can result in underpolish or overpolish, raising fabrication issues. As an example, underpolish causes the MEMS capacitor to short or results in MEMS cavity voids; whereas, overpolish causes MEMS cavity heights being out of specification. In addition, it is known that lithography depth of focus issues can arise due to taller cavity structures, for example. Other problems include reactive ion etch (RIE) rate or bias variability, induced by the local layout or pattern factor of the chip.

Metrology structures assist in the fabrication of the devices on the chip. These metrology structures can also be used as a means to measure focal planes for performing more accurate lithographic and etching processes, amongst other features. The metrology structures can also be used to test the electrical characteristics of the MEMS structures fabricated within a product chip. The metrology structures are fabricated within the dicing channel, which is referred to as a kerf, or randomly placed within a test die. However, it is difficult or impossible to place a MEMS test structure within the kerf, due to size limitations. For example, the MEMS test structure can be about 200 microns in width, while the kerf is typically about 40 to 90 microns in width. Also, it is known that metrology structures randomly placed within a test die or within the kerf can affect the actual devices in the chip product due to, for example, proximity effects and metal pattern factor effects.

Accordingly, there exists a need in the art to overcome the deficiencies and limitations described hereinabove.

SUMMARY

In a first aspect of the invention, a method comprises forming one or more metrology test structures in a test die that are identical or nearly identical to one or more structures formed in an adjacent product chip.

In another aspect of the invention, a method comprises forming test structures in a test die, adjacent to product chips. The test structures and formed substantially identically to structures in the product chips, using same processing steps and materials.

In yet another aspect of the invention, a structure comprises a plurality of test MEMS structures in a test die each of which comprise a cavity structure. The structure further comprises a plurality of MEMS structures in a chip product each of which comprise a cavity structure identical or nearly identical to the cavity structure of the plurality of test MEMS structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the metrology test structures, which comprises the structures of the present invention. In still further embodiments, a method in a computer-aided design system is provided for generating a functional design model of the metrology test structures. The method comprises generating a functional representation of the structural elements of the metrology test structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 1A shows a steal primary die reticle map;

DETAILED DESCRIPTION

Figure 1B:
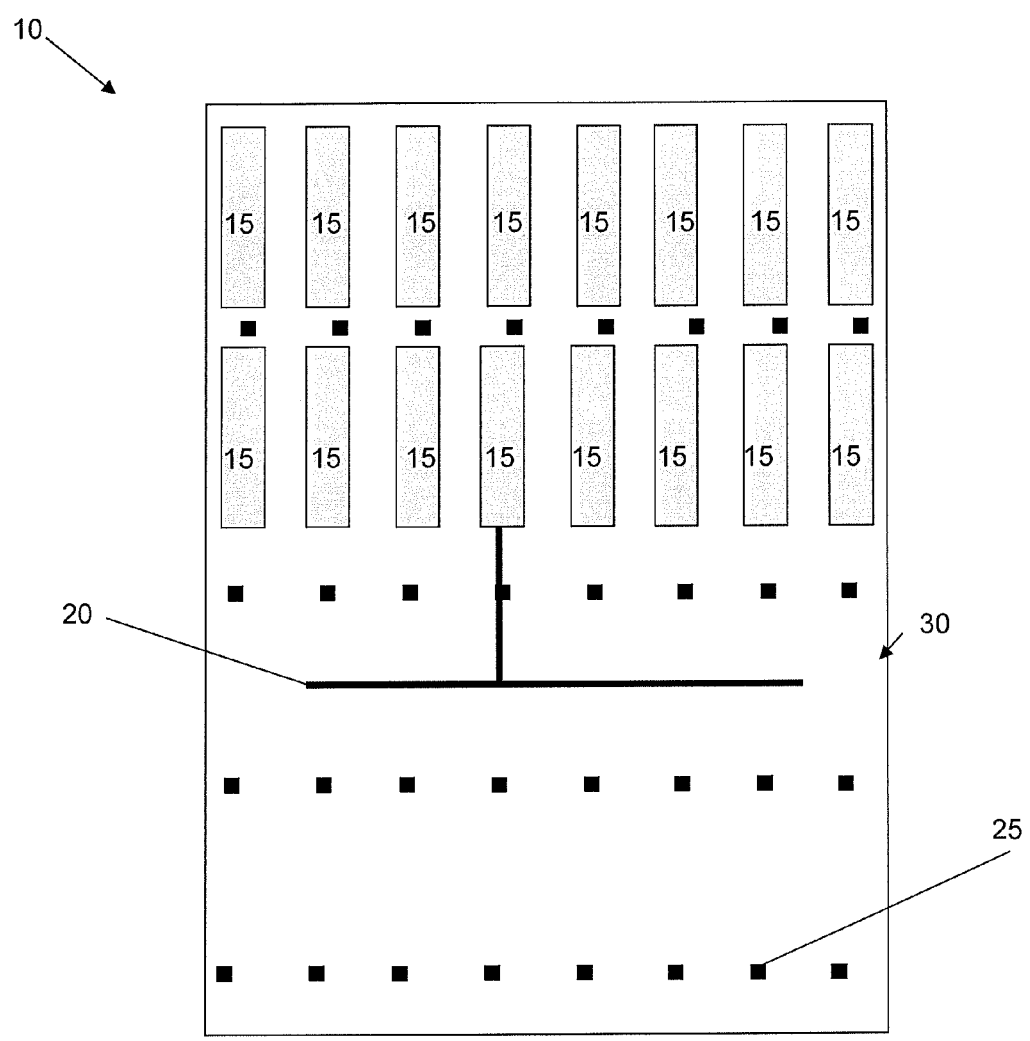
FIG. 1B shows a product chip layout in accordance with aspects of the present invention.

The invention relates to semiconductor structures and methods of manufacture and, more particularly, to test dies comprising metrology test structures and methods of manufacture. More specifically, the present invention provides metrology test structures in a steal primary die (test die), which are representative of components of a product chip layout. In more specific embodiments, the present invention is directed to metrology MEMS (Micro-Electro-Mechanical System) structures provided in a steal primary die, which duplicate or substantially duplicate a product chip layout and, in particular, which are identical or substantially identical to critical levels of the product layout involving MEMS cavities. In embodiments, the present invention is also applicable to RF MEMS devices, as well as other active and passive components provided on a substrate as described herein.

In more specific embodiments, the present invention relates to an integrated chip (IC) comprising test structures on a test die (e.g., steal primary die) formed adjacent to a product chip on a substrate. In embodiments, the test chip comprises MEMS structures (having MEMS cavities) which are the same or substantially the same as MEMS structures (having MEMS cavities) in the product chips, in at least material and/or structure and/or layout. In embodiments, the MEMS structures are arranged at least on a perimeter of the test chip, and test pads (e.g., DC test pads) are located within the test chip but not within the product chips. By having the MEMS cavities' layout in the test die as the same as the product chips, CMP, RIE, etc., processing issues affecting the steal primary die and product chip MEMS devices are avoided during fabrication.

Advantageously, by using the steal primary dies of the present invention, metrology test structures will exhibit the same or substantially the same electrical characteristics of components, e.g., MEMS, in the product chip, regardless of processing variability. For example, the metrology test structures will exhibit the same capacitance of MEMS structures placed in the product chip, regardless of chemical mechanical polishing steps, e.g., under polishing or over polishing due to proximity effects, or other pattern factor effects. In this way, it is now possible to obtain more accurate metrology data, e.g., performance data of components used in the product chip. Also, the metrology test structures (MEMS structures) formed on the test die can be used to perform simple wafer acceptance tests prior to bumping and packaging to verify yield and reliability of wafer.

Furthermore, the present invention will substantially reduce or eliminate electrical test variability for parameters such as delta capacitance and pull-in voltage due to different MEMS silicon cavity pattern factors. This, in turn, will increase yield and reliability of the manufacturing process. Also, the present invention eliminates the need for metrology structures in the dicing channel (i.e., kerf), which do not provide reliable test data due to pattern factors and processing variability.

A steal primary die reticle map is shown in FIG. 1A. The product chips 1 and steal primary die test chips 2 are grouped into the reticle field and are printed using a lithography scanner where multiple reticle fields are printed on the wafer. The size of the reticle field shown in FIG. 1A is determined by several factors including the maximum field size of the lithography scanner. Typical maximum field sizes are on the order of 5 cm by 5 cm and vary by lithographic scanner manufacturer. In this example, the approximate field size is 3.6 cm (Y direction) by 3.4 cm (X direction) and both the steal primary die 1 and product chip 2 have an approximate size of 3.7 mm (Y direction) and 2.9 mm (X direction) with an approximately 0.1 mm wide dicing channel between the chips inside the reticle field.

FIG. 1B shows a representative product chip layout in accordance with aspects of the present invention. It should be understood by those of skill in the art that the product chip layout of FIG. 1B is merely an illustrative example, and that other layouts are also contemplated by the present invention. Accordingly, the present invention should not be limited to the product chip layout of FIG. 1B. It should be understood by those of ordinary skill in the art that product chip layout has a repeating layout of first mask levels which are affected by adjacent chip topography, such that creating a test die which uses the same set of first mask levels using the same layout as the production chip results in a way to predict yield or reliability of the production chip. In addition, the product chip may be designed using best known methods, such as putting in dummy fill features to reduce cross-chip variability due to CMP, RIE, etc. and placing the MEMS cavities in regularly spaced arrays.

Specifically, FIG. 1B shows a product chip layout 10 comprising a plurality of MEMS structures 15, in a certain layout. The MEMS structures 15 each include a MEMS cavities, in addition to other MEMS structures such as, for example, a beam structure, electrodes, etc. The width of undeviated MEMS cavities is determined by the characteristic CMP planarization length. The MEMS structure 15 can be of different dimensions and structures, depending on the desired pull-in voltage requirements, capacitance, or other engineering requirements. The product chip layout 10 also includes other features such as wiring layers 20, I/O pads 25, etc. In embodiments, the product chip layout 10 further includes an edge or perimeter area 30, as discussed in more detail with reference to FIG. 3.

As should be understood by those of skill in the art, the MEMS structures can be formed using any conventional MEMS fabrication process, known to those of skill in the art. For example, depending on the particular application and engineering criteria, the MEMS structures 15 can come in many different forms. For example, MEMS structures 15 can be realized in the form of a cantilever structure or a bridge structure. In the cantilever structure, for example, a cantilever arm (suspended electrode) is pulled toward a fixed electrode by application of a voltage. The voltage required to pull the suspended electrode to the fixed electrode by electrostatic force is called pull-in voltage, which is dependent on several parameters including the length of the suspended electrode, spacing or gap between the suspended and fixed electrodes (i.e., cavity), and spring constant of the suspended electrode, which is a function of the materials and their thickness. Alternatively, the MEMS structure could be acoustic wave resonator beams, accelerometers, gyroscopes, bolometer pixels, or any other suspended structures inside a cavity.

The MEMS structures 15 can be manufactured in a number of ways using a number of different tools. In general, though, the methodologies and tools are used to form small structures with dimensions in the micrometer scale with switch dimensions of approximately 0.1 to 5 microns thick, 10 to 100 microns wide, and 20 to 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask. These fabrication processes can also be supplemented by other processes including venting of sacrificial material to form the cavity, as well as CMP and RIE processes to form planar surfaces, etc. As should be understood by those of ordinary skill in the art, under polishing or under etching causes MEMS capacity shorting, MEMS cavity voids, et.; whereas, over polishing or over etching causes MEMS cavity height issues, etc.

Figure 2:
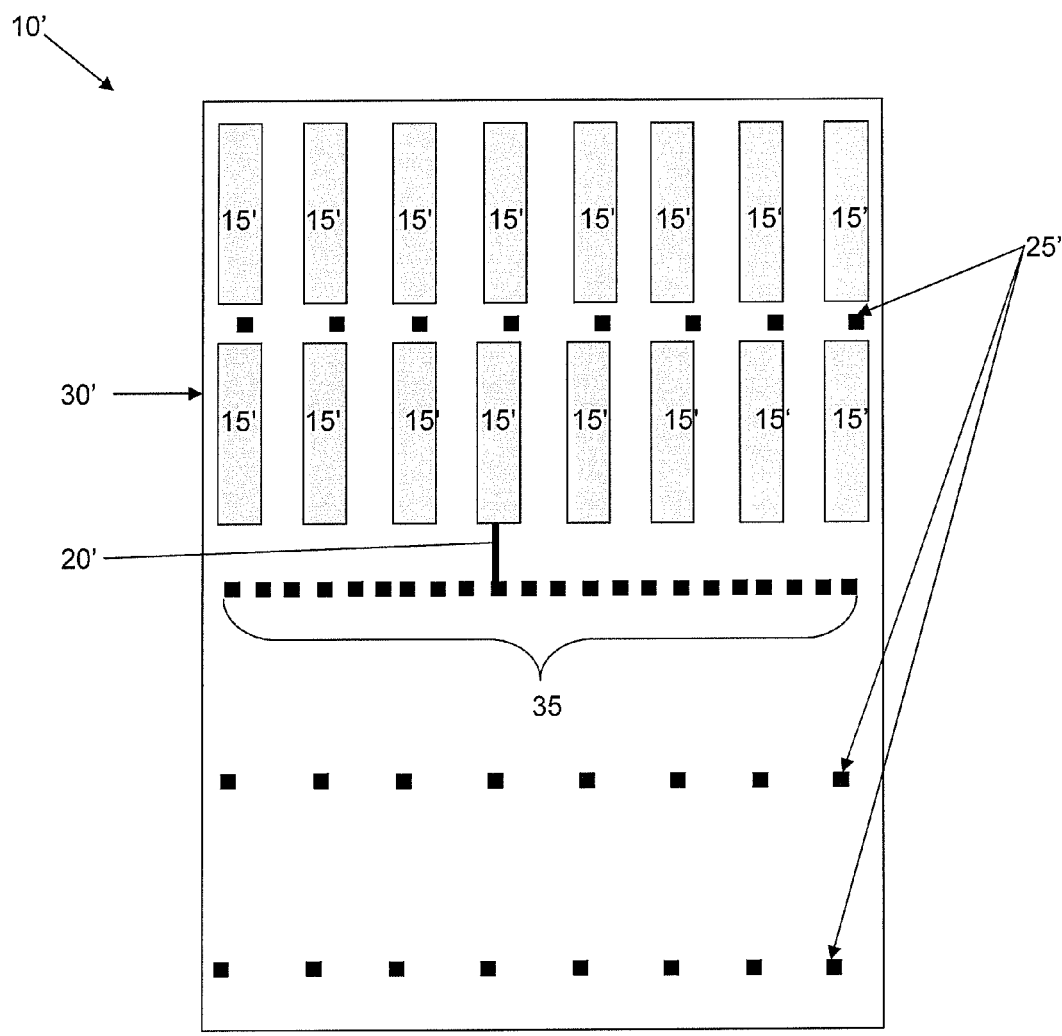
FIG. 2 shows a test die (steal primary die) layout representing the product chip layout of FIG. 1B, in accordance with aspects of the present invention.

FIG. 2 shows a steal primary die layout representing the product chip layout of FIG. 1B, in accordance with aspects of the present invention. In embodiments, the steal primary die layout 10' includes MEMS cavity structures identical (or substantially identical) in structure and layout to the MEMS cavity structures, on the product chip layout of FIG. 1B. By duplicating the product chip MEMS cavity layout on the steal primary die, it is now possible to eliminate any changes in the local pattern factor between the product chips, as well as any adverse impact on CMP, RIE, etc. uniformity that would otherwise result in structures being placed within a dicing channel or randomly placed within a steal primary die. Also, as the dicing channel is only about 50 μm to 90 μm in width, it is now possible to test a MEMS structure, which is about 200 μm and which could otherwise not be placed within the dicing channel. Moreover, the steal primary die layout 10' of the present invention improves yield and reliability, compared to randomly placing structures on the steal primary die or within the dicing channel. This is because randomly placing MEMS structures, for example, in a steal primary die or within the dicing channel can impact adjacent product chips due to known pattern factor effects, etc.

More specifically, FIG. 2 shows a steal primary die layout 10' comprising a plurality of MEMS structures 15' each comprising a MEMS cavity and other structures similar to that described with reference to FIG. 1B. The MEMS cavity structures 15' are identical (or substantially identical) in both structure and layout relative to the MEMS structures 15 of the chip product layout of FIG. 1B. In embodiments, the MEMS cavity structures 15' can be designed similarly or identically to the product chip shown in the FIG. 1B and fabricated using the same processing steps and materials as those described in FIG. 1B. In this way, the characteristics, e.g., capacitance, pull-in voltage, etc., of the MEMS structures 15' will be identical (or substantially identical) as those of FIG. 1B, thus providing dependable, accurate and reliable metrology data.

It should be understood by those of skill in the art that the steal primary die layout 10' of FIG. 2 can have other test structures which are identical to those of the product chip layout, in MEMS cavity material, dimensions and/or layout but differing inside the MEMS cavity. For example, the steal primary die layout and the product chip layout can have identical RF MEMS devices, or other passive or active devices in the same layout configuration. Also, it should be understood that other structures shown in the steal primary layout 10' can be different than those of the product chip layout 10. For example, in embodiments, the steal primary die layout 10' can include different wiring layers 20' and/or I/O pads 25', as well as horizontally aligned DC test pads 35, provided adjacent to the MEMS structures 15'. The DC test pads 35 can be used to attach test probes thereto, in order to obtain metrology data of the MEMS structures (or other structures). The DC probe card test pads can be used for each of the embodiments of the present invention, e.g., steal primary die layouts. FIG. 2 also shows the edge or perimeter area 30'.

Figure 3:
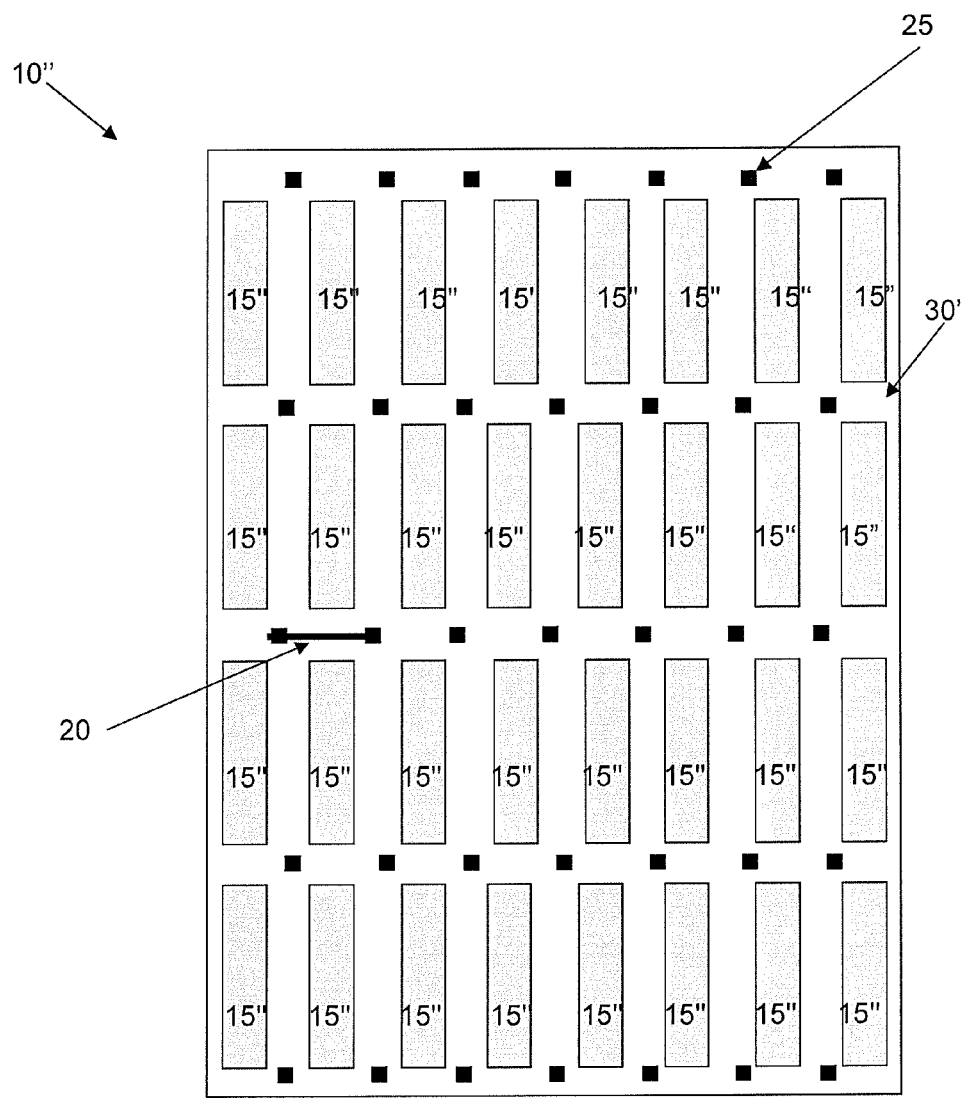
FIG. 3 shows a product chip layout of FIG. 1B, in accordance with aspects of the present invention.

FIG. 3 shows a product chip with a symmetric or nearly symmetric MEMS cavity layout such that the spacing between MEMS cavities 15'' inside the chip 10'' is the same or nearly the same as the spacing of the outside edge 30' of MEMS cavities of two adjacent chips. This symmetric or nearly symmetric layout reduces process-induced variability, such as CMP removal, since the local pattern factor and layout in chip and chip to chip is the same or nearly the same.

Figure 4A:
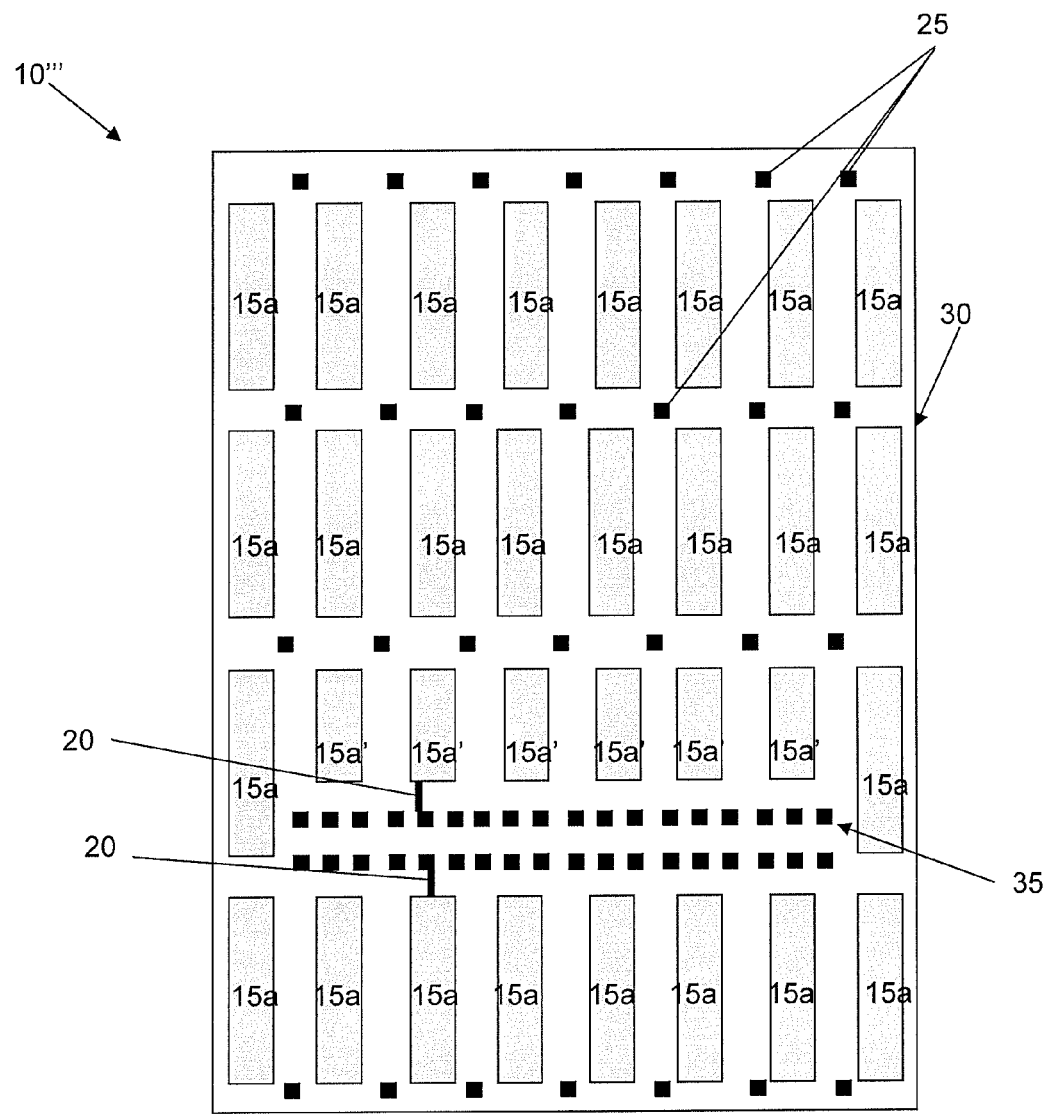
FIG. 4A shows a steal primary die layout representing the product chip layout of FIG. 3 with shortened MEMS cavities, in accordance with aspects of the present invention.

FIG. 4A shows a steal primary die layout representing the product chip layout of FIG. 3, in accordance with aspects of the present invention. In this embodiment, the product chip layout includes MEMS cavities 15a and MEMS cavities 15a'. In embodiments, the MEMS cavities 15a' are shorter than the MEMS cavities 15a or 15'' of FIG. 3; whereas, the MEMS 15a are of the same dimension (size) as the MEMS cavities 15'' of FIG. 3. The MEMS cavities 15a' are provided to accommodate the DC test pads 35 used to attach test probes thereto, in order to obtain metrology data of the MEMS structures (or other structures). The MEMS cavities 15a' and the MEMS cavities 15a can be connected to selected DC pads 35 by the wirings 20. The DC pads 35 run horizontal along the product chip layout 10'''', with a selected DC pads on the first row being connected to the MEMS cavities 15a' and selected DC pads on the second row of being connected to the MEMS cavities 15a, by the wirings 20. In embodiments, the MEMS cavities 15a provided along the edge 30 of the steal primary die are identical or similar to that in FIG. 3 product chip along the outside chip edge but differ away from the outside chip edge.

By using the configuration of FIG. 4A, it is possible to eliminate any changes in the local pattern factor between product chips, as well as any adverse impact on CMP uniformity. Moreover, a MEMS test structure can be utilized, while yields and reliability can be improved, compared to randomly placing structures on the steal primary die. The dc test pads 35 are placed inside the chip, far from the chip edge, and the MEMS cavities on the chip edge are identical or similar to the ones in the product chip shown in FIG. 3. The width of the steal primary die chip edge region which is designed to emulate the product chip is a function of the CMP and other processes used. In one example, the outer 100 microns of the steal primary die chip are designed to emulate the product chip.

Figure 4B:
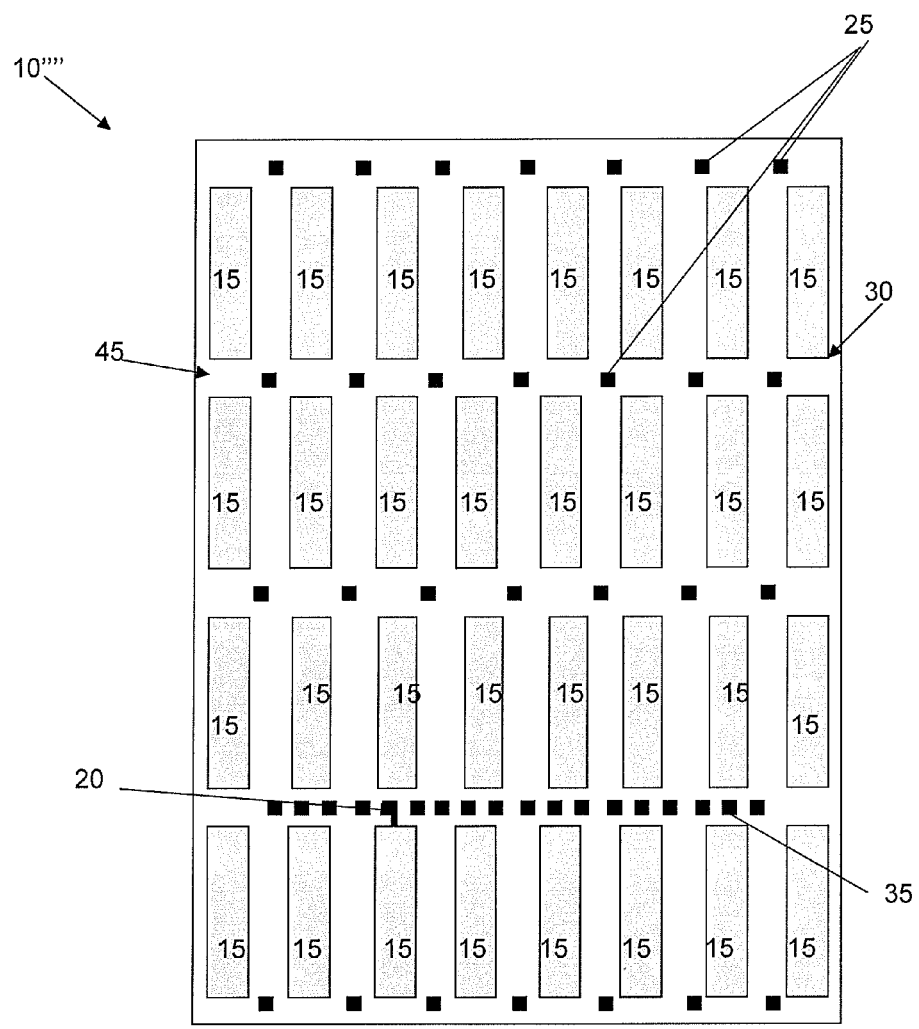
FIG. 4B shows a steal primary die layout representing the product chip layout of FIG. 3, in accordance with aspects of the present invention.

FIG. 4B shows a steal primary die layout representing the product chip layout of FIG. 3, in accordance with aspects of the present invention. In FIG. 4B, the steal primary die layout 10'''' comprises a plurality of MEMS structures 15 each comprising a MEMS cavity and other related structures, e.g., beam, electrodes, etc. of the same shape. The MEMS structures 15 are placed remotely from an edge 30 of the steal primary die layout 10'''', e.g., within an active area of the steal primary die layout 10''''. In embodiments, the edge area 30 of the primary die layout 10' is about 50 μm deep and is identical or nearly identical in shape and location of the edge area of the product chip layout of any of the other embodiments and particularly FIG. 3. In embodiments, the edge area 30 is devoid of any structures which significantly impacts the MEMS cavities. As in all of the embodiments, the edge area 30 will be a function of the process run and can range from about 5 microns to upwards of 5000 microns. In this way, any components placed within the active area 45 of the steal primary die layout 10'''' will not affect the product chip, as already discussed herein.

As the edge area 30 of the primary die layout 10'''' and the edge area of the product chip layout 10 of FIG. 3 are identical or nearly identical, the layout of the remaining components, e.g., MEMS structures 15'' within the active area of the steal primary die layout, does not need to be identical to the product chip layout of FIG. 3. For example, in the representative steal primary die layout 10'' of FIG. 3, only MEMS structures are identical to the MEMS structures of the chip product layout of FIG. 3. In embodiments, the MEMS structures 15 can be fabricated using the same processing steps as those described in FIG. 3. Accordingly, the characteristics, e.g., capacitance, pull-in voltage, etc., of the MEMS structures 15 will be identical or substantially identical as those of FIG. 3, thus providing dependable, accurate and reliable metrology results.

It should be understood by those of skill in the art that the steal primary die layout of any of the embodiments herein can have other test components which are identical in material, dimensions and/or layout to those of the product chip layout 10 of FIG. 1B. For example, the steal primary die layout and the product chip layout can have identical RF MEMS devices, or other passive or active devices in the same or different layout within the area 45. Also, it should be understood that other structures shown in the steal primary layout can be different than those of the product chip layout. For example, in embodiments, the steal primary die layout can include vertically aligned pad structures 25, provided on sides of the MEMS structures, as well as other structures such as wiring layers and I/O pads 35. The pad structures can be used to attach test probes thereto, in order to obtain metrology data of the MEMS structures (or other structures). The primary die layout of FIG. 4B (or any of the other embodiments) can include other test or dummy structures.

Figure 5:
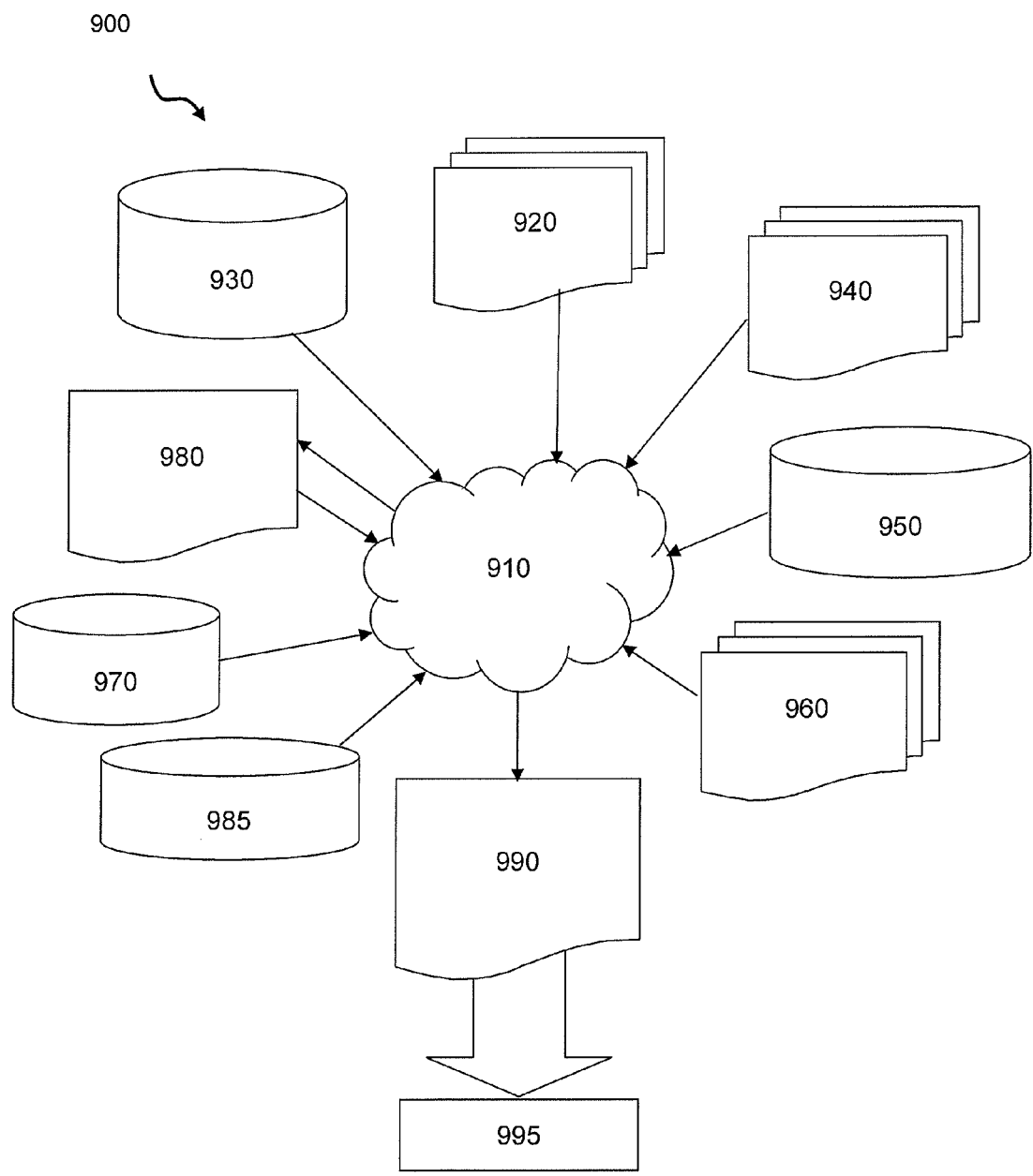
FIG. 5 is a flow diagram of a design process used in semiconductor design, manufacture, and/or test.

FIG. 5 is a flow diagram of a design process used in semiconductor design, manufacture, and/or test. FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1A, 1B-4A and 4B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1A, 1B-4A and 4B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1A, 1B-4A and 4B to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A, 1B-4A and 4B. In one embodiment, design structure 990 may comprise a compiled, executable HDL simulation model that functionally simulates the devices shown in FIGS. 1A, 1B-4A and 4B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A, 1B-4A and 4B. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method comprising forming one or more metrology test structures in a test die that are identical or nearly identical to one or more structures formed in an adjacent product chip, wherein the forming of the one or more metrology test structures is formed remotely from an edge area of the test die and the edge area is about 50 µm in width.

2. The method of claim 1, wherein the one or more metrology test structures have electrical characteristics identical or nearly identical to the one or more structures in the product chip, regardless of processing variability.

3. The method of claim 1, wherein the forming of the one or more metrology test structures is formed in a same or substantially same layout as the one or more structures in the product chip.

4. The method of claim 1, wherein a layout of the one or more metrology test structures is different from a layout of the one or more structures in the product chip, and is connected to test pad structures.

5. The method of claim 1, wherein the one or more metrology structures are Micro-Electro-Mechanical System (MEMS) structures.

6. The method of claim 1, further comprising forming test pads in the test die, and electrically connected the test pads to the one or more metrology test structures.

7. The method of claim 6, further comprising obtaining characteristics of the one or more metrology test structures using the test pads.

8. The method of claim 1, wherein the one or more metrology test structures are formed outside a kerf area.

9. The method of claim 1, wherein the one or more metrology test structures is formed simultaneously with the one or more structures in the product chip.

10. The method of claim 1, wherein the one or more metrology test structures is formed remotely from an edge of the product chip and the test die so as to not affect processing of the one or more structures in the product chip.

11. A method comprising forming test structures in a test die, adjacent to product chips, the test structures and structures on the product chips are formed substantially identically, using same processing steps and materials, wherein the test structures and the structures are MEMS structures with identical or nearly identical cavity structures.

12. The method of claim 11, wherein the test structures and the structures are formed in a same layout or substantially a same layout in the test die and the product chip, respectively.

13. The method of claim 11, wherein the test structures and the structures are formed within an inner region of the test die and the product chip, respectively, and are formed in a different layout.

14. The method of claim 13, wherein the test structures and the structures are formed remotely from an edge area, that is devoid of any structures.

15. The method of claim 11, further comprising avoiding chemical mechanical polishing issues during fabrication of the structures by having the cavities of the test structures and the structures formed identically or nearly identically.

16. The method of claim 11, wherein the forming of the test structures is formed remotely from an edge area of a test die and the edge area is about 50µm in width.

17. The method of claim 11, wherein the MEMS structures are formed at least on a perimeter of the test die with test pads formed within the test die.

18. The method of claim 11, wherein the MEMS structures exhibit a same capacitance of MEMS structures placed in the product chip, regardless of chemical mechanical polishing steps.

19. A method comprising forming test structures in a test die, adjacent to product chips, the test structures and structures on the product chips are formed substantially identically, using same processing steps and materials, wherein:

the test structures and structures are formed outside of a dicing channel; and the test structures and structures are formed with identical or substantially identical cavity structures.

\* \* \* \* \*